United States Patent
Cho et al.

(10) Patent No.: US 8,216,503 B2
(45) Date of Patent: Jul. 10, 2012

(54) METHOD FOR MANUFACTURING PRINTED CIRCUIT BOARD USING IMPRINTING

(75) Inventors: Jae-Choon Cho, Suwon-si (KR); Myeong-Ho Hong, Suwon-si (KR); Senug-Hyun Ra, Seongnam-si (KR); Hyuk-Soo Lee, Seongnam-si (KR); Jeong-Bok Kwak, Suwon-si (KR); Jung-Woo Lee, Gunpo-si (KR); Choon-Keun Lee, Suwon-si (KR); Sang-Moon Lee, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 501 days.

(21) Appl. No.: 11/819,720

(22) Filed: Jun. 28, 2007

(65) Prior Publication Data
US 2008/0008824 A1    Jan. 10, 2008

(30) Foreign Application Priority Data
Jul. 10, 2006  (KR) .................. 10-2006-0064575

(51) Int. Cl.
*B05D 5/12* (2006.01)
*B28B 3/00* (2006.01)
*B29C 59/02* (2006.01)
*B05D 3/04* (2006.01)
*H05K 1/09* (2006.01)

(52) U.S. Cl. ........ 264/319; 264/132; 264/320; 264/330; 264/331.11; 427/97.7; 427/98.2; 427/271; 427/301; 174/250; 174/255; 174/256; 174/257

(58) Field of Classification Search ............... 427/97.7, 427/98.2, 271, 301; 264/132, 313, 319, 320, 264/330, 331.11; 174/250, 255, 256, 257
See application file for complete search history.

(56) References Cited

U.S. PATENT DOCUMENTS

| | | | | |
|---|---|---|---|---|
| 4,731,311 | A | * | 3/1988 | Suzuki et al. ............... 429/213 |
| 5,308,796 | A | * | 5/1994 | Feldman et al. ............ 438/655 |
| 6,060,121 | A | * | 5/2000 | Hidber et al. ............... 427/261 |
| 6,287,968 | B1 | * | 9/2001 | Yu et al. ..................... 438/675 |
| 6,663,820 | B2 | * | 12/2003 | Arias et al. ................. 264/496 |
| 6,746,751 | B2 | * | 6/2004 | Lamotte et al. ............. 428/141 |
| 7,063,762 | B2 | * | 6/2006 | Foster et al. ................ 156/150 |
| 2004/0105218 | A1 | * | 6/2004 | Masuda et al. .............. 361/523 |
| 2005/0004336 | A1 | * | 1/2005 | Mabrouk ..................... 526/258 |
| 2006/0134338 | A1 | * | 6/2006 | Chen et al. .................. 427/402 |

* cited by examiner

*Primary Examiner* — Christina Johnson
*Assistant Examiner* — Atul P Khare

(57) ABSTRACT

A method for manufacturing a printed circuit board, in which an oxidant capable of polymerizing conductive polymers is selectively marked on a board using imprinting, and the monomer of a conductive polymer is filled in the selected pattern and polymerized, to provide a conductive polymer wiring pattern. With the method for manufacturing a printed circuit board, a printed circuit board can be given finer wiring widths to allow a highly integrated, highly efficient printed circuit board. Thus, a printed circuit board (PCB) or a flexible printed circuit boards (FPCB) can be manufactured that is applicable to industrial, clerical, and domestic electric electronic products, by forming conductive polymer wiring using imprinting.

10 Claims, 1 Drawing Sheet

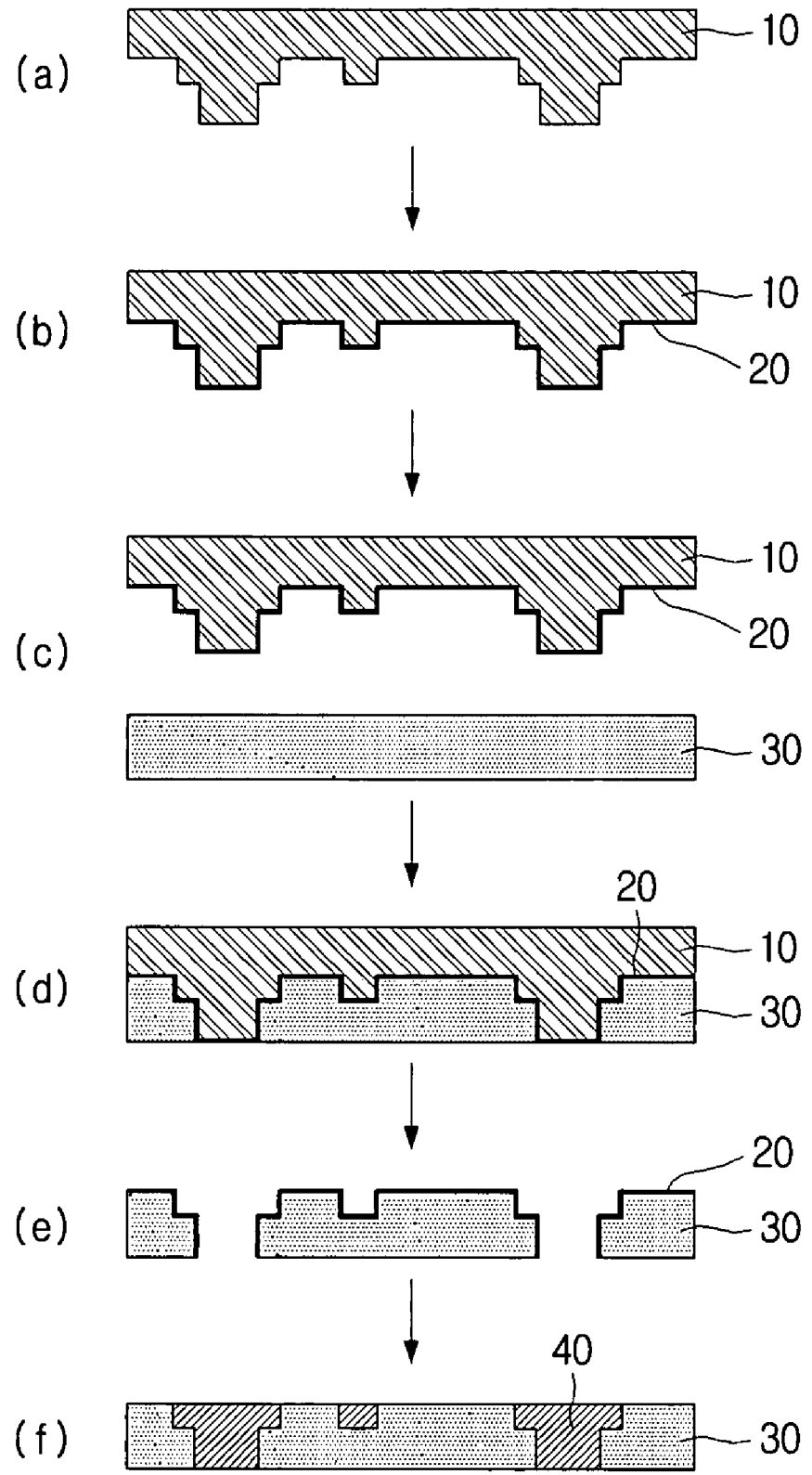

METHOD FOR MANUFACTURING PRINTED CIRCUIT BOARD USING IMPRINTING

CROSS-REFERENCE TO RELATED APPLICATIONS

This application claims the benefit of Korean Patent Application No. 10-2006-0064575 filed with the Korean Intellectual Property Office on Jul. 10, 2006, the disclosure of which is incorporated herein by reference in its entirety.

BACKGROUND

1. Technical Field

The present invention relates to a method for manufacturing a printed circuit board, more particularly to a method for manufacturing a printed circuit board, in which an oxidant capable of polymerizing conductive polymers is selectively marked on a board using imprinting, and the monomer of a conductive polymer is filled in the selected pattern and polymerized, to provide a conductive polymer wiring pattern.

2. Description of the Related Art

In the past, a printed circuit board (PCB) was manufactured by pressing a copper foil onto epoxy resin or phenol resin, which are thermosetting/insulating resins, with a heat-plate press to make a PCB substrate or by plating a copper film directly onto a resin board.

However, with the recent trends toward thinner and more functional electronic products, the printed circuit board is also becoming smaller and more packaged, with finer patterns, where one of the methods most widely used for manufacturing minute structures is photolithography, which is a method of forming a pattern on a board coated with a photoresist thin film. Here, the size of the pattern formed is limited by the optical diffraction. Thus, photolithography entails the problems that, as the degree of integration of components is increased, physical differences may appear in the photoresist pattern itself or in the spaces in-between the pattern due to the interferences on the light, and also that reactions between the photoresist and impurities created during the processes may erode the photoresist such that a pattern may be formed that is different from the one desired. Furthermore, there is a complication in the processes of having to remove the resist.

Meanwhile, a method for forming fine wiring of a nano-level size is to use the imprinting method. This is a method of fabricating a required shape on the surface of a relatively stronger material beforehand, and then imprinting it like a stamp on another material to form fine patterns. In the conventional imprinting method, a mold was fabricated to have a pattern that corresponds with the fine pattern of a desired shape, and then patterning by imprinting on a resin insulation layer, and plating the inside of the pattern with a conductive metal to form the fine pattern.

This method has the advantage that mass production may readily be achieved with a lower cost compared to that of the photoresist pattern forming method. However, there is also a drawback in that it is difficult to apply the printed circuit board manufactured using the conventional printing method to flexible components of a large area.

SUMMARY

An aspect of the present invention is to provide a method for manufacturing a printed circuit board having conductive polymer wiring using imprinting.

One aspect of the invention provides a method for manufacturing a printed circuit board, which includes: preparing a mold, which has a relievo pattern in correspondence with the wiring pattern to be formed; coating a polymerizing oxidant on the surface of the mold on which the pattern is formed; pressing the mold onto a resin layer; separating the mold from the resin layer to form a pattern in the resin layer, such that the polymerizing oxidant is adsorbed on the pattern; and selectively filling the monomer of a conductive polymer inside the pattern formed in the resin layer and polymerizing, to form a conductive polymer wiring.

In one embodiment, the mold may be formed with a material selected from a group consisting of a semiconductor, a ceramic, a metal, a polymer, $SiO_2$, quartz, glass, and combinations thereof.

The polymerizing oxidant may be any one or more selected from a group consisting of neutral proton donors such as $H_2O$, HCl, HBr, $HNO_3$, $H_2SO_4$, carboxylic acid, phenol, and alcohol; cations such as $Li^+$, $Mg^{2+}$, and $Br^+$; and metal compounds such as $AlCl_3$, $BF_3$, $TiCl_4$, $FeCl_3$, and $ZnCl_2$.

Here, the coating of the polymerizing oxidant may be performed by dipping the mold in an oxidant solution.

The resin layer may be formed with at least one resin selected from a group consisting of thermosetting resins such as epoxy resin, phenol resin, vinylester resin, unsaturated polyester resin, maleimide resin, and vinylbenzene compounds; and thermoplastic resins such as polyetherimide, polyethersulfone, polyacetal, and dicyclopentadiene-group resins.

The method for manufacturing a printed circuit board, according to an aspect of the invention, may further include performing surface treatment on portions of the upper surface of the resin layer excluding the inside of the pattern formed in the resin layer, before the filling of the monomer of a conductive polymer. In one embodiment, the surface treatment may include cleaning the upper surface of the resin layer with a polar solvent to remove the polymerizing oxidant, or may include polishing the upper surface of the resin layer to remove the polymerizing oxidant.

The conductive polymer may be at least one selected from a group consisting of polyacetylene, polypyrrole, polythiophene, poly(3-alkylthiophene), polyphenylene sulfide, polyphenylene vinylene, polythienylene vinylene, polyphenylene, polyisothianaphthalene, polyazulene, polyfurane, and polyaniline.

During the polymerization, at least one compound selected from a group consisting of $I_2$, $Br_2$, Li, Na, K, $AsF_5$, $BF_4^-$, $ClO_4^-$, $FeCl_4^-$, tosylate, HCl, anthraquinone-2-sulfonic acid sodium salt, 2-naphthalene sulfonic acid sodium salt, 2,6-naphthalene disulfonic acid disodium salt, sodium p-toluene sulfonate, naphthol yellow S, and nitrobenzene sulfonic acid sodium salt may be used as a dopant.

The forming of the conductive polymer wiring may be performed using solution polymerization or gas phase polymerization.

Additional aspects and advantages of the present invention will become apparent and more readily appreciated from the following description, including the appended drawings and claims, or may be learned by practice of the invention.

BRIEF DESCRIPTION OF THE DRAWINGS

FIG. 1 is a cross-sectional process diagram schematically illustrating a method for manufacturing a printed circuit board according to an embodiment of the invention.

DETAILED DESCRIPTION

The method for manufacturing a printed circuit board according to certain embodiments of the invention will be described below in more detail with reference to the accompanying drawing.

An aspect of this invention is to manufacture a printed circuit board having a conductive polymer wiring pattern, by marking an oxidant capable of polymerizing conductive polymers selectively on a board using imprinting, and filling and polymerizing the monomer of a conductive polymer in the selected pattern.

FIG. 1 is a cross-sectional process diagram schematically illustrating a method for manufacturing a printed circuit board according to an embodiment of the invention. The manufacturing process of a printed circuit board using imprinting is described below with reference to FIG. 1.

First, a mold 10 is prepared in which a relievo pattern is formed that is in correspondence with the wiring pattern to be formed (operation a).

The mold 10 used in embodiments of the invention is not limited to particular materials. Specific examples, however, for the mold 10 may be divided into transparent molds and untransparent molds, where transparent molds may use materials that allow the transmission of UV rays such as $SiO_2$, quartz, glass, and polymers, etc., while untransparent molds may be formed of a material such as a semiconductor, ceramic, metal, or polymer, or a combination thereof.

Any method publicly known in the relevant field of art may be used for the method of manufacturing the mold 10, such as printing a pattern on a surface of a plate-shaped material via shape-processing procedures or manufacturing individual structures separately and attaching them onto a plate-shaped material. Specific examples may use laser beam lithography, photolithography, dicing, lasers, RIE (reactive ion etching) processes, or etching processes, etc.

The size of the relievo pattern of the mold 10 may be 0.1 to 50 μm, to be applicable to the vias and the fine pattern of the printed circuit board, but it is not limited to a particular range.

Next, a polymerizing oxidant 20 is coated on the surface of the mold 10 on which the pattern is formed (operation b).

In general, methods for polymerizing a conductive polymer in a liquid phase may be divided into electrochemical methods and chemical oxidation methods. The electrochemical method is to apply a particular voltage in an electrolyte and obtain polymers that have been attached and polymerized on the surfaces of the electrodes, and the chemical oxidation method is to obtain polymers using an oxidant. For example, when polymerizing polypyrrole using the latter method, a pyrrole monomer, anthraquinone-2-sulfonic acid sodium salt, and $FeCl_3$ oxidant are reacted in distilled water, and then filtered, cleansed, and dried, to obtain polypyrrole.

However, in certain embodiments of the invention, an oxidant 20, such as the $FeCl_3$, is coated on the surface of the pattern on the mold 10 for forming a conductive polymer wiring, whereby the oxidant 20 may selectively be adsorbed on the pattern transferred by an imprinting process onto the resin layer 30, as shown in FIG. 1. Thus, in a subsequent process, the conductive polymer 40 may be selectively adsorbed and polymerized on the pattern of the resin layer 30.

The oxidant 20 used in an embodiment of the invention is not limited to particular compounds, as long as it is a polymerizing oxidant. Specific examples of a polymerizing oxidant that may be used include, first, neutral proton donors, such as $H_2O$, HCl, HBr, $HNO_3$, $H_2SO_4$, carboxylic acid, phenol, and alcohol, etc. Second, cations, etc., may be used, such as $Li^+$, $Mg^{2+}$, and $Br^+$, etc. Lastly, metal compounds, etc., may be used, such $AlCl_3$, $BF_3$, $TiCl_4$, $FeCl_3$, and $ZnCl_2$, etc.

The method of coating the oxidant 20 may include spin coating, droplet dispensing, or spraying, etc., but in terms of convenience, the oxidant 20 may be coated by dipping the mold 10 in an oxidant solution. Here, the surface of the mold 10 on which the pattern is formed may be partially dipped in the oxidant solution.

Next, the mold 10 thus coated with oxidant 20 is pressed onto the resin layer 30 (operation c and operation d).

The resin layer 30 is not limited to particular materials, as long as it is of a material that can be used as a substrate, and may be, for example, a thermosetting resin, such as epoxy resin, phenol resin, vinylester resin, unsaturated polyester resin, maleimide resin, and vinylbenzene compounds, etc., or a thermoplastic resin, such as polyetherimide, polyethersulfone, polyacetal, and dicyclopentadiene-group resins, etc.

The resin layer 30 may be prepared by coating liquid resin on a substrate, and then drying or semi-curing the liquid resin as necessary. The liquid resin may be coated on the substrate using a process such as handcasting, droplet dispensing, spin coating, spraying, or inkjet printing, etc. The semi-curing process of the liquid resin may vary depending on the type of resin, and may include thermal setting or UV setting. Here, the resin layer 30 may be of a suitable thickness such that does not leave residue on the pattern formed via the imprinting process.

The pattern of the mold 10 is pressed and printed onto the resin layer 30 thus prepared.

Next, the mold 10 is separated from the resin layer 30, whereby the pattern is formed in the resin layer 30, with the polymerizing oxidant 20 adsorbed on the pattern (operation e).

When the resin layer 30 is separated and removed from the mold 10, the vias and the circuit pattern corresponding to the pattern of the mold 10 is imprinted and formed in the resin layer 30. Here, since the oxidant 20 has a greater interaction with the resin layer 30 than with the mold 10, it is adsorbed onto the resin layer 30 during the process of separating and removing the mold 10, to remain selectively on the portion where the pattern has been formed.

Here, while the oxidant 20 may be adsorbed inside the pattern formed in the resin layer 30, it may be absorbed and may remain on the upper surface of the resin layer 30. In a subsequent operation of selectively polymerizing a conductive polymer inside the pattern, it may be necessary to take measures to prevent polymerization on the upper surface of the resin layer 30.

Thus, in certain embodiments of the invention, an operation of performing surface treatment on the upper surface of the resin layer 30, excluding the inside of the pattern formed in the resin layer 30, may additionally be included before filling in the monomer of the conductive polymer, so that there is no polymerization on the upper surface of the resin layer 30.

In one embodiment, the surface treatment may include cleaning the upper surface of the resin layer with a polar solvent to remove the polymerizing oxidant, or may include mechanically polishing the upper surface of the resin layer to remove the polymerizing oxidant.

Next, the monomer of a conductive polymer is selectively filled and polymerized inside the pattern formed in the resin layer 30, to form the conductive polymer wiring 40 (operation f).

The conductive polymer may be at least one selected from a group consisting of polyacetylene, polypyrrole, polythiophene, poly(3-alkylthiophene), polyphenylene sulfide, polyphenylene vinylene, polythienylene vinylene, polyphenylene, polyisothianaphthalene, polyazulene, polyfurane, and polyaniline, but it is not thus limited.

During the polymerization, at least one compound selected from a group consisting of halogen gas such as $I_2$, $Br_2$; alkaline metal such as Li, Na, K; $AsF_5$, $BF_4^-$, $ClO_4^-$, $FeCl_4^-$, tosylate, HCl, anthraquinone-2-sulfonic acid sodium salt, 2-naphthalene sulfonic acid sodium salt, 2,6-naphthalene disulfonic acid disodium salt, sodium p-toluene sulfonate, naphthol yellow S, and nitrobenzene sulfonic acid sodium salt may be used as a dopant. For example, polypyrrole polymerized only with an oxidant has a greatly reduced conductivity at high temperatures, but if an anthraquinone-based sulfonic acid or sulfonic acid salt is used as a dopant, the polypyrrole can be manufactured to have superb thermal stability. Electrical conductivity is known to increase the more when greater amounts of oxidant are used and when the reaction is performed at lower temperatures.

Here, the forming of the conductive polymer wiring may be performed using solution polymerization or gas phase polymerization, but it is not thus limited, and any method known in the art may generally be used for forming polymers.

Embodiments of the invention will be illustrated below with reference to the following examples, but it is to be appreciated that the scope of the invention is not limited to the following examples.

EXAMPLE 1

1 kg of the oxidant $FeCl_3$ was dissolved in a mixed solution of water 0.9 L/methanol 0.1 L, to produce an oxidant mixed solution. A relievo mold made of a Ni material was dipped into an oxidant aqueous solution thus produced, such that the solution was sufficiently coated on the surface of the mold. A semi-cured epoxy board was pressed using the coated mold with a pressure of 1 MPa at 100° C. for 30 minutes, and afterwards pressed at 170° C. for 2 hours. After lowering the temperature, the mold was separated, and the board coated with oxidant was dipped in an aqueous solution containing 0.04 M of pyrrole and 0.015 M of anthraquinone-2-sulfonate under a nitrogen atmosphere for two hours, to polymerize polypyrrole in the pattern and form wiring.

EXAMPLE 2

1 kg of the oxidant $FeCl_3$ was dissolved in a mixed solution of water 0.9 L/methanol 0.1 L, to produce an oxidant mixed solution. A relievo mold made of a Ni material was dipped into an oxidant aqueous solution thus produced, such that the solution was sufficiently coated on the surface of the mold. A semi-cured epoxy board was pressed using the coated mold with a pressure of 1 MPa at 100° C. for 30 minutes, and afterwards pressed at 170° C. for 2 hours. After lowering the temperature, the mold was separated, and the board coated with oxidant was placed in a vacuum oven together with an aqueous solution containing 0.04 M of pyrrole and 0.015 M of anthraquinone-2-sulfonate. A vacuum was applied, whereby volatilized pyrrole monomers were selectively polymerized in the pattern coated with oxidant, to form the wiring.

With the method for manufacturing a printed circuit board according to certain aspects of the invention as set forth above, not only can the manufacturing process and costs be greatly reduced compared to conventional lithography processes, but also a printed circuit board can be given finer wiring widths to allow a highly integrated, highly efficient printed circuit board. Thus, a printed circuit board (PCB) or a flexible printed circuit boards (FPCB) can be manufactured that is applicable to industrial, clerical, and domestic electric electronic products, by a new technique of forming conductive polymer wiring using imprinting.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. A method for manufacturing a printed circuit board, the method comprising the steps of:
    preparing a mold having a surface comprising a relievo pattern, the relievo pattern having a size of 0.1 to 50 μm;
    coating a polymerizing oxidant solution onto the mold surface comprising the relievo pattern;
    pressing the mold surface comprising the polymerizing oxidant solution coating into a semi-cured resin layer;
    separating the mold from the resin layer to form the relievo pattern in the resin layer, the resulting patterned layer having polymerizing oxidant solution from the mold surface adsorbed thereon;
    performing surface treatment on portions of the upper surface of the resin layer excluding the inside of the pattern formed therein to remove the polymerizing oxidant from the non-excluded portions;
    selectively filling the monomer of a conductive polymer over the remaining polymerizing oxidant inside the pattern formed in the resin layer; and
    polymerizing the selectively filled monomer to form a non-metallic conductive polymer fine wiring having a size corresponding to that of the relievo pattern formed on the mold,
    wherein the conductive polymer directly contacts the semi-cured resin, and
    wherein the surface treatment includes cleaning the upper surface of the resin layer with a polar solvent to remove the polymerizing oxidant or polishing the upper surface of the resin layer to remove the polymerizing oxidant.

2. The method of claim 1, wherein the mold is formed with a material selected from the group consisting of a semiconductor, a ceramic, a metal, a polymer, $SiO_2$, quartz, glass, and combinations thereof.

3. The method of claim 1, wherein the polymerizing oxidant is any one or more of compounds selected from the group consisting of:
    a neutral proton donor selected from the group consisting of $H_2O$, HCl, HBr, $HNO_3$, $H_2SO_4$, carboxylic acid, phenol, and alcohol;
    a cation selected from the group consisting of as $Li^+$, $Mg^{2+}$, and $Br^+$; and
    a metal compound selected from the group consisting of $AlCl_3$, $BF_3$, $TiCl_4$, $FeCl_3$, and $ZnCl_2$.

4. The method of claim 1, wherein the coating of the polymerizing oxidant is performed by dipping the mold in an oxidant solution.

5. The method of claim 1, wherein the resin layer is formed with at least one resin selected from the group consisting of epoxy resin, phenol resin, vinylester resin, unsaturated polyester resin, maleimide resin, vinylbenzene compounds, polyetherimide, polyethersulfone, polyacetal, and dicyclopentadiene-group resins.

6. The method of claim 1, wherein the surface treatment includes cleaning the upper surface of the resin layer with the polar solvent to remove the polymerizing oxidant.

7. The method of claim 1, wherein the surface treatment includes polishing the upper surface of the resin layer to remove the polymerizing oxidant.

8. The method of claim 1, wherein the conductive polymer is at least one selected from the group consisting of polyacetylene, polypyrrole, polythiophene, poly(3-alkylthiophene), polyphenylene sulfide, polyphenylene vinylene, polythienylene vinylene, polyphenylene, polyisothianaphthalene, polyazulene, polyfurane, and polyaniline.

9. The method of claim 1, wherein at least one compound selected from the group consisting of $I_2$, $Br_2$, Li, Na, K, $AsF_5$, $BF_4^-$, $ClO_4^-$, $FeCl_4^-$, tosylate, HCl, anthraquinone-2-sulfonic acid sodium salt, 2-naphthalene sulfonic acid sodium salt, 2,6-naphthalene disulfonic acid disodium salt, sodium p-toluene sulfonate, naphthol yellow S, and nitrobenzene sulfonic acid sodium salt is used as a dopant during the polymerization.

10. The method of claim 1, wherein the forming of the conductive polymer wiring is performed using solution polymerization or gas phase polymerization.

* * * * *